(12) United States Patent
Ebihara

(10) Patent No.: US 9,967,505 B1
(45) Date of Patent: May 8, 2018

(54) COMPARATORS FOR DOUBLE RAMP ANALOG TO DIGITAL CONVERTER

(71) Applicant: OMNIVISION TECHNOLOGIES, INC., Santa Clara, CA (US)

(72) Inventor: Hiroaki Ebihara, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days. days.

(21) Appl. No.: 15/486,815

(22) Filed: Apr. 13, 2017

(51) Int. Cl.
*H04N 5/378* (2011.01)
*H03K 5/24* (2006.01)
*H03M 1/56* (2006.01)
*H04N 5/374* (2011.01)

(52) U.S. Cl.
CPC ........... *H04N 5/378* (2013.01); *H03K 5/2472* (2013.01); *H03M 1/56* (2013.01); *H04N 5/374* (2013.01)

(58) Field of Classification Search
CPC ........ H04N 5/378; H04N 5/374; H04N 5/335; H03K 5/2472; H03M 1/56; H03M 1/185; H03M 1/361; G05F 1/10
See application file for complete search history.

(56) References Cited

U.S. PATENT DOCUMENTS

| | | | | |
|---|---|---|---|---|
| 6,970,022 B1 * | 11/2005 | Miller | ................... | H03K 3/3565 327/205 |
| 8,767,106 B2 * | 7/2014 | Ueno | ....................... | H03F 3/72 250/208.1 |
| 9,041,581 B2 * | 5/2015 | Wolfs | .................... | H03M 1/185 341/159 |
| 9,288,417 B2 * | 3/2016 | Tanaka | ................... | H04N 5/335 |
| 2003/0001625 A1 * | 1/2003 | Jaussi | ................ | H03K 3/35613 327/65 |
| 2011/0279718 A1 * | 11/2011 | Yoo | ..................... | H03F 3/45188 348/300 |

* cited by examiner

*Primary Examiner* — Luong T Nguyen
(74) *Attorney, Agent, or Firm* — Christensen O'Connor; Johnson Kindness PLLC

(57) ABSTRACT

Example comparators as disclosed herein may include a first comparator comprising a first plurality of device areas, wherein the first plurality of device areas at least includes a first comparator input device area, a first comparator cascode device area, and a first comparator current mirror area, and a second comparator comprising a second plurality of device areas, wherein the second plurality of device areas at least includes a second comparator input device area, a second comparator cascode device area, and a second comparator current mirror area, where the second comparator input area is disposed between the first comparator input area and the first comparator cascode device area, the first comparator cascode device area is disposed between the second comparator input area and the second comparator cascode device area, the first comparator current mirror area is disposed between the first comparator cascode device area and the second comparator current mirror area, the second comparator cascode device area is disposed between the first comparator cascode device area and the second comparator current mirror area, and the second comparator current mirror area is disposed between the first comparator current mirror area and a second comparator second stage input area.

20 Claims, 6 Drawing Sheets

COMPARATORS FOR DOUBLE RAMP ANALOG TO DIGITAL CONVERTER

TECHNICAL FIELD

This disclosure relates generally to image sensors, and in particular but not exclusively, relates to analog to digital converters of an image sensor.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Image sensors conventionally receive light on an array of pixels, which generates charge in the pixels. The intensity of the light may influence the amount of charge generated in each pixel, with higher intensity generating higher amounts of charge. The charge may be converted into a digital representation of the charge by the image sensor based on a comparison to a reference voltage signal. The comparison may conventionally be performed by a comparator, which provides an output as the digital representation of the charge. However, noise may be injected into the output by the comparator. Additionally, the outputs of the comparator may affect to the input and cause some errors.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
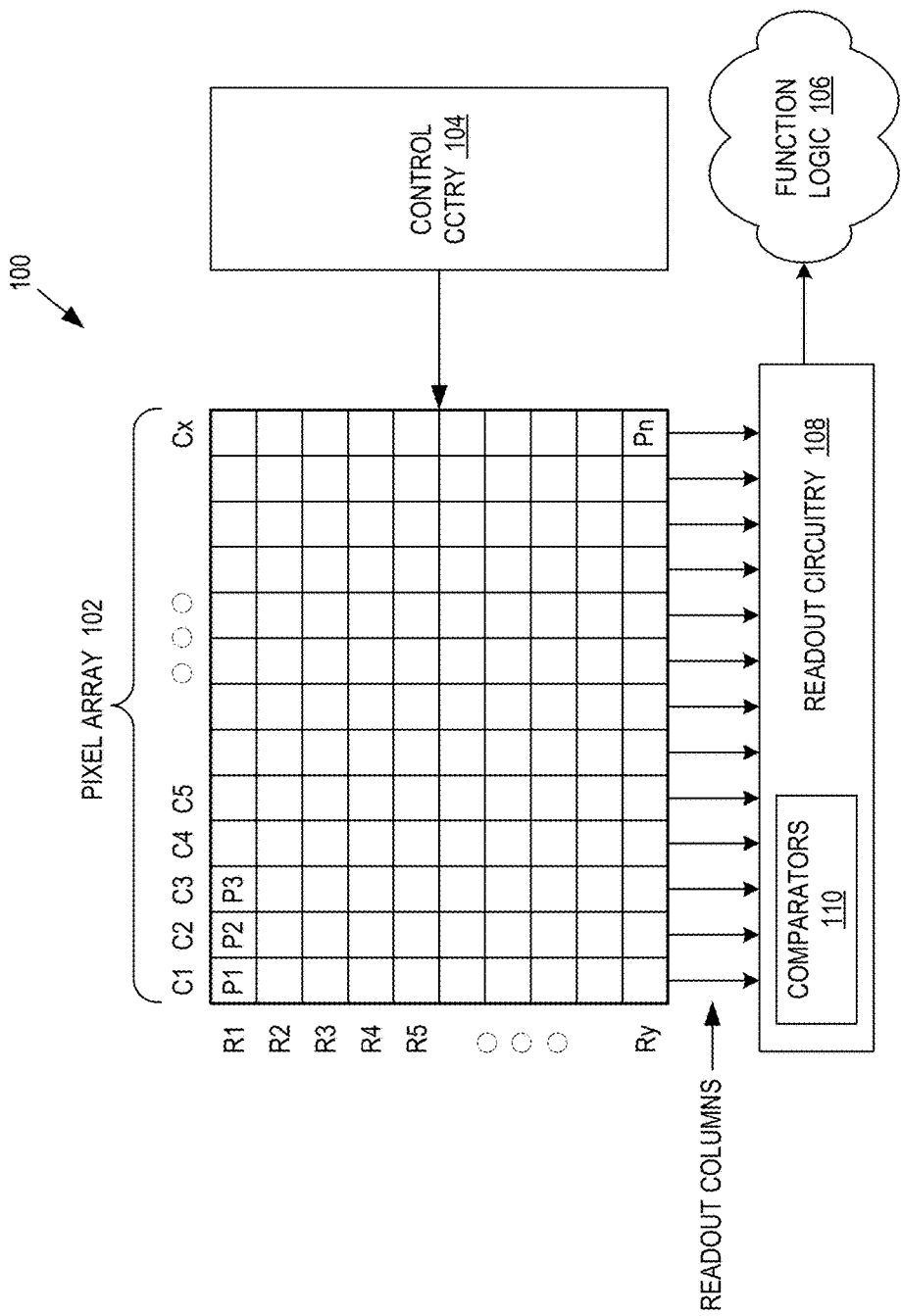
FIG. 1 illustrates one example of an imaging system in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with distributedly arranged analog to digital converters are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 illustrates one example of an imaging system 100 in accordance with an embodiment of the present disclosure. Imaging system 100 includes pixel array 102, control circuitry 104, readout circuitry 108, and function logic 106. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image data or image charge, the image data is readout by readout circuitry 108 and then transferred to function logic 106. Readout circuitry 108 may be coupled to readout image data from the plurality of photodiodes in pixel array 102. In various examples, readout circuitry 108 may include amplification circuitry, analog-to-digital (ADC) conversion circuitry, or otherwise. In some embodiments, one or more comparators 110 may be included for each of the readout columns. The one or more comparators 110 may be included in a respective analog-to-digital converter (ADC) included in the readout circuitry 108, for example. Function logic 106 may simply store the image data or even manipulate the image data by applying post image effects (e.g., crop, rotate, remove red eye, adjust brightness, adjust contrast, or otherwise). In one example, readout circuitry 108 may readout a row of image data at a time along readout column lines (illustrated) or may readout the image data using a variety of other techniques (not illustrated), such as a serial readout or a full parallel readout of all pixels simultaneously.

In some embodiments, the readout circuitry 108 may include two comparators 110 for each readout column.

Using two comparators 110 for each readout column may allow for simultaneously reading out image data from multiple rows. For example, two rows may be readout simultaneously with one row provided to one comparator 110 and the other row provided to the other comparator 110. In some embodiments, each comparator 110 may be a dual-stage comparator and further include cascode devices in a first stage. The two comparators 110 may be arranged so that a portion of the first stage, the cascode devices and a current mirror for example, may be physically arranged with the second stage on the semiconductor substrate. Such physical arrangement may reduce a conductor length that provides the output of the first stage to the input of the second stage, which reduces parasitic capacitance. Reducing parasitic capacitance may allow for faster ADC operations, which may result in faster frame rates for the imaging system 100.

In one example, control circuitry 104 is coupled to pixel array 102 to control operation of the plurality of photodiodes in pixel array 102. For example, control circuitry 104 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
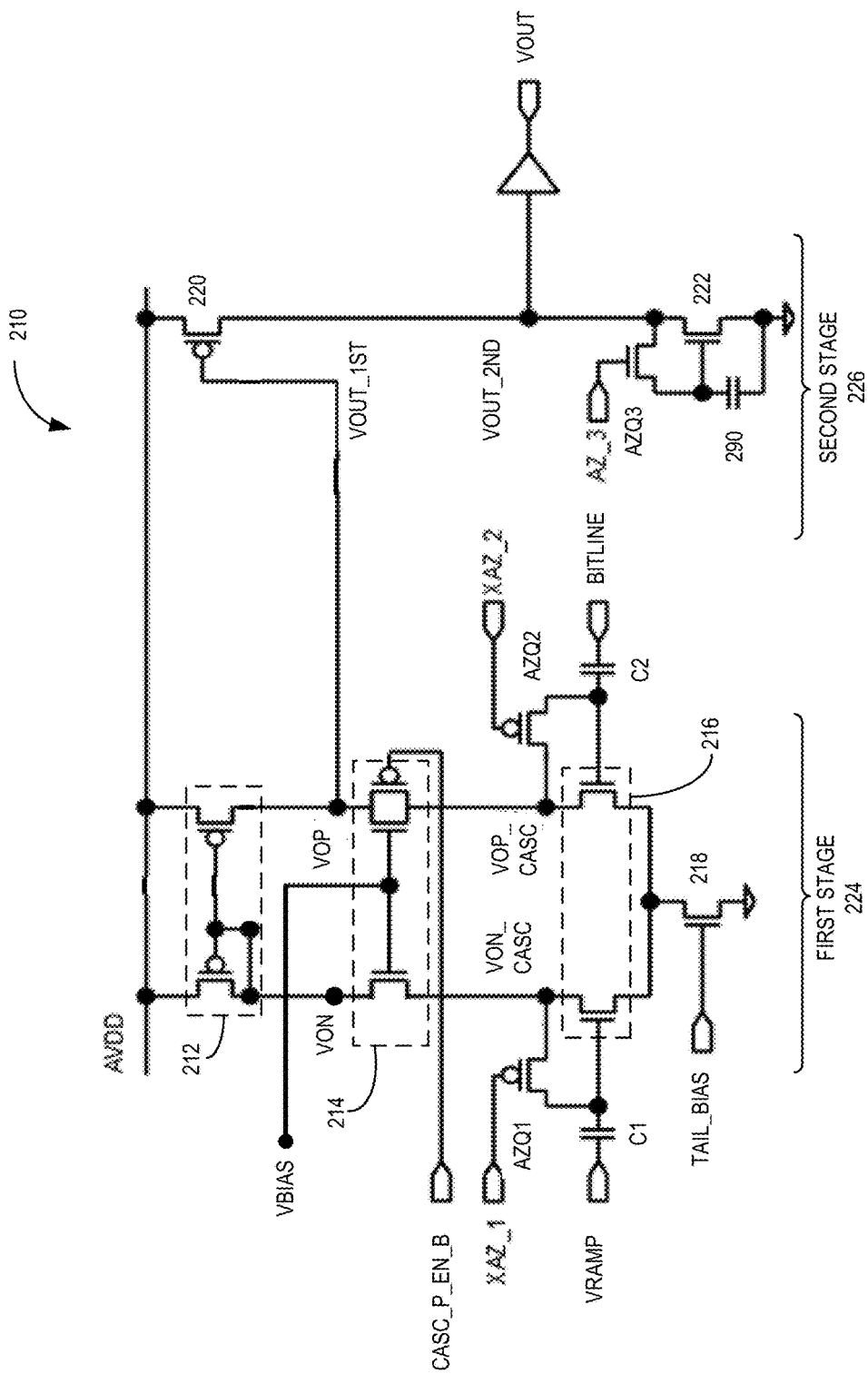
FIG. 2 is a comparator in accordance with an embodiment of the present disclosure.

FIG. 2 is a comparator 210 in accordance with an embodiment of the present disclosure. The comparator 210 may be an example of one of the comparators 110. The comparator 210 may provide an output signal in response to a comparison of an image charge signal received on the BITLINE input to a reference voltage signal VRAMP received on the VRAMP input. In some embodiments, the comparator 210 may be included in an analog-to-digital converter (ADC). Additionally, the various control signals received by the comparator 210 may be provided by imaging system control circuitry, such as the control circuitry 104.

The illustrated embodiment of the comparator 210 includes a first stage 224 and a second stage 226. The first stage 224 may be coupled to receive the image charge voltage signal on the BITLINE input and further coupled to receive VRAMP on the VRAMP input, e.g., the reference voltage input. The first stage 224 may provide a first output VOUT_1ST to the second stage 226, which, in response, may provide a second output VOUT_2ND to an optional buffer. An output of the optional buffer may provide the output VOUT of the comparator 210. The first stage 224 may be biased to flip, e.g., change the level of VOUT_1ST, based on a comparison between VRAMP and the image charge voltage signal on the BITLINE input. A voltage on a capacitor 290 of the second stage 226 may provide the reference voltage for the second stage 226 set point, which may determine the final VOUT based thereon.

The illustrated embodiment of the first stage 224 includes PMOS current mirror 212, cascode devices 214, NMOS input transistors 216, NMOS tail transistor 218, and auto-zero switches AZQ1 and AZQ2. The PMOS current mirror 212 may include two PMOS transistors coupled together at their gates and coupled in parallel between a reference voltage, a high reference voltage denoted as AVDD, and nodes VON and VOP. Further, gates of the PMOS current mirror 212 transistors may be coupled to the node VON. The cascode devices 214 may be coupled between the nodes VON and VOP and nodes VON_CASC and VOP_CASC. The NMOS input transistors 216 may be coupled between the nodes VON_CASC and VOP_CASC and the NMOS tail transistor 218.

The cascode devices 214 includes one PMOS and two NMOS transistors with the PMOS and one NMOS transistor coupled like a pass gate, for example. One NMOS transistor is coupled between nodes VON and VON_CASC and the PMOS and the NMOS connected like pass gate are coupled between VOP and VOP_CASC as shown in FIG. 2. The gates of the NMOS transistors may be coupled to a bias voltage VBIAS, which may keep the NMOS transistors operating in saturation region at around flipping point of the second stage 226. The gate of the PMOS transistor may be coupled to receive control signal CASC_P_EN_B, which may enable/disable the PMOS transistor of the cascode devices 214. Enabling/disabling the PMOS of the cascode devices 214 may affect the voltage difference between the nodes VOP and VOP_CASC. When the PMOS device is turned on, the pair of the PMOS and the NMOS work as pass gate so that the voltage of VOP and VOP_CASC are same. On the other hand, when the PMOS device is turned off, all of the current pass through the NMOS device so that the NMOS device works as cascade stage at around flipping point of the comparator and the voltage swing of VOP is limited.

The auto-zero switches AZQ1 and AZQ2 may be coupled between gates of the NMOS input transistors 216, and nodes VON_CASC and VOP_CASC, respectively. The auto-zero switches AZQ1 and AZQ2 may be enabled to couple the gates of their respective NMOS input transistors 216 to the respective nodes VON_CASC and VOP_CASC. Enabling the switches auto-zeros, e.g., normalizes, the gate voltage of their respective NMOS input transistors 216 to the voltage on the respective nodes. The PMOS in the cascade devices may be enabled during auto-zero, e.g., normalization, and VOP and VOP_CAC are coupled so that VOP and VOP_CAN are coupled to the gate of NMOS input transistor on BITLINE side of the comparator, The NMOS input transistors 216 may be coupled to receive VRAMP and the image charge voltage signal. The first stage 224 may change a value of VOUT_1ST based on a comparison of the image charge voltage signal on the BITLINE input to VRAMP during an ADC operation. VOUT_1ST may be an intermediate voltage provided to the second stage 226.

The illustrated embodiment of the second stage 226 includes an input PMOS transistor 220, a reference input transistor 222, a capacitor 290, and a control switch AZQ3. During auto-zero of the 1st stage, control switch AZQ3 may be enabled, so that the drain and the gate of the NMOS transistor 222 are shorted and the gate of NMOS transistor 222 may be biased to draw the same current as the PMOS input transistor 220 outputs. And the capacitor 290 may be charged to the bias voltage with which the NMOS transistor 222 draws the same current as the PMOS input device 220. In this way, the NMOS transistor 222 may provide a voltage as the reset point of the second stage 226. For example, the second stage 226 may flip when the input, e.g., VOUT_1ST, falls below its auto-zero voltage, the voltage when the 1st stage is reset. If the input voltage to the second stage 226 is higher than its auto-zero voltage, the output current of the PMOS input transistor 220 may be smaller than the current drawn by the NMOS transistor 222 so that VOUT_2ND becomes low. Conversely, if the input voltage to the second stage 226 is lower than its auto-zero voltage, VOUT_2ND becomes high because the current drawn by the NMOS transistor 222 may be smaller than the output current from the PMOS input transistor 220.

The input to the second stage, e.g., VOUT_1ST, may be provided to the gate of the PMOS input transistor 220 through the cascode devices 214. By having cascade devices 214, the output of the 1st stage VOP is separated from VOP_CASC so that the parasitic capacitance on VOP can be reduced. And the smaller parasitic capacitance results in smaller delay of the comparator and shorter ADC period.

Figure 3:
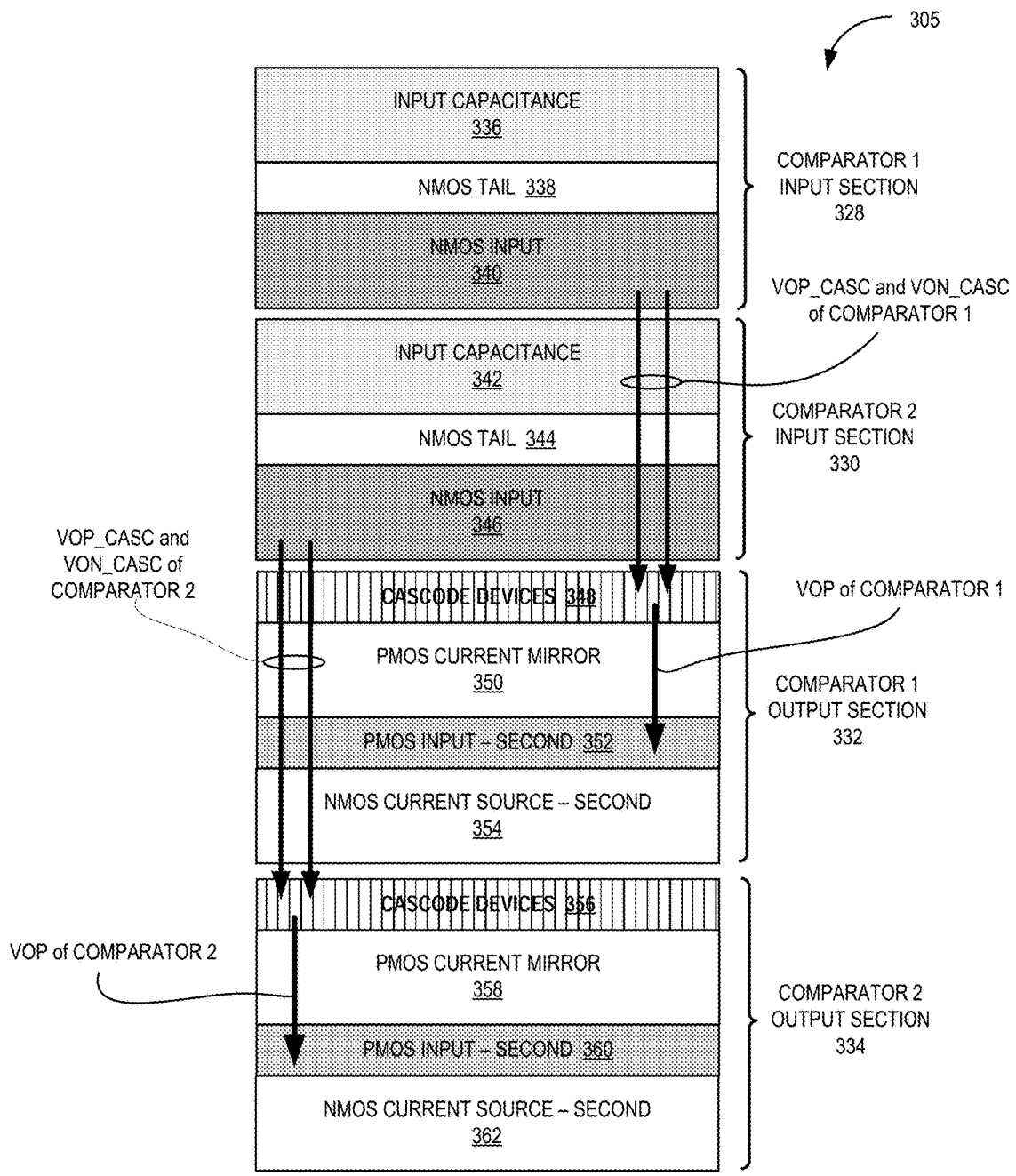
FIG. 3 is an example layout of two comparators physically arranged on a semiconductor die in accordance with an embodiment of the present disclosure.

FIG. 3 is an example layout 305 of two comparators physically arranged on a semiconductor die in accordance with an embodiment of the present disclosure. The layout 305 may be an example of functional areas of a semiconductor die including the two comparators, such as two comparators 210. Each functional area shown in layout 305 may represent one or more materials used to form a respective device or devices, including conductors, insulators, etc., and each functional area may correspond to like labeled devices of the comparator 210. The various functional areas of the layout 305 may form two comparators with various portions, e.g., functional blocks, of the two comparators broken up such that each comparator may not be contiguous and may be separated by areas of the other comparator. Additionally, functional areas of the first stage of the comparators may be separated from other functional areas of the first stage. For example, comparator 1 input section 328 may be separated from comparator 1 output section 332 by comparator 2 input section 330. By separating various sections of the comparators 1 and 2 the parasitic capacitance between the output of comparator 1 and comparator 2 input stage may be reduced and so cross talk from comparator 1 to comparator 2 may be reduced. But the parasitic capacitance associated with metal traces coupling the functional areas of the comparators 1 and 2 may be increased, which may lead to increased ADC periods. In some embodiment, by having cascade devices the parasitic capacitance on VOP, which affects most to the delay of the comparator, can be smaller and ADC period may be shorter.

The illustrated embodiment of comparator 1 includes a first stage and a second stage. The first stage may include an input capacitance area 336, an NMOS tail area 338, an NMOS input area 340, a cascode devices area 348, and a PMOS current mirror area 350. However, the physical arrangement of the areas that form the first stage may be broken up into at least two sections. For example, the input capacitance area 336, NMOS tail area 338, and the NMOS input area 340 may be arranged contiguously to form the comparator 1 input section 328. The remaining areas of the first stage, such as the cascode devices area 348 and the PMOS current mirror area 350 may be arranged separately, but formed into a contiguous block with areas of the second stage. The comparator 1 input section 328 may be referred to as "input" for ease of discussion, and may only include a portion of the first stage, and such labeling should not be considered limiting.

The second stage of comparator 1 may include a PMOS input—second area 352 and an NMOS current source—second area 354. These two areas may be formed into a contiguous block. In some embodiments, however, the NOMS current source—second area 352 may not be contiguous with the remaining areas of the comparator 1 output section 332. Additionally, and as noted, the areas of the second stage may also be formed contiguously with the areas of the first stage not arranged with areas of the comparator 1 input section 328. By locating the cascode devices area 348, the PMOS current mirror area 350 with the PMOS input—second area may allow a reduction in parasitic capacitances on the comparator 1st stage output VOP.

The comparator 1 input section 328 may be separated from comparator 1 output section 332 by comparator 2 input section 330. Additionally, the NMOS input area 340 may be coupled to the cascode devices area 348 by relatively long conductors that extend across/over/through the areas of the comparator 2 input section 330. The conductors are depicted by the arrows labeled Vop_casc and Von_casc of comparator 1, which may be formed from conductive traces disposed in the various functional areas of comparator 2 input section 330.

Comparator 2 may include similar areas as comparator 1, and those areas may be similarly separated. For example, comparator 2 input section 330 may include three areas of a first stage, such as input capacitance area 342, NMOS tail area 344, and NMOS input area 346. Additionally, comparator 2 output section 334 may include first stage areas cascode devices area 356 and PMOS current mirror area 358 along with second stage areas PMOS input—second area 360 and NMOS current source—second area 362. However, instead of the input and output sections 330 and 332 of comparator 2 being separated by comparator 1 input section 328, the input and output sections 330, 332 are separated by comparator 1 output section 332. As such, conductive traces that couple comparator 2 input section 330 with comparator 2 output section 334 may extend over/across/through the comparator 1 output section 332.

For both comparator 1 and 2, the output of the first stage may be coupled to the input of the second stage with a short conductive trace that extends from a cascode area to a PMOS input—second area through a PMOS current mirror area. Because the areas are adjacently arranged, the conductive trace may extend over/across/through the PMOS current mirror area. For example, the VOP of comparator 1 may extend from cascode devices area 348 to the PMOS input—second area 352, which extends over/across/through the PMOS current mirror area 350. By co-locating these various areas of the output sections 330, 334 together, the conductive path for VOP from the cascode devices to the input of the second stage may be reduced. Reduction of the conductive path may reduce associated parasitic capacitance, which may reduce ADC period and increase frame rate.

Figure 4:
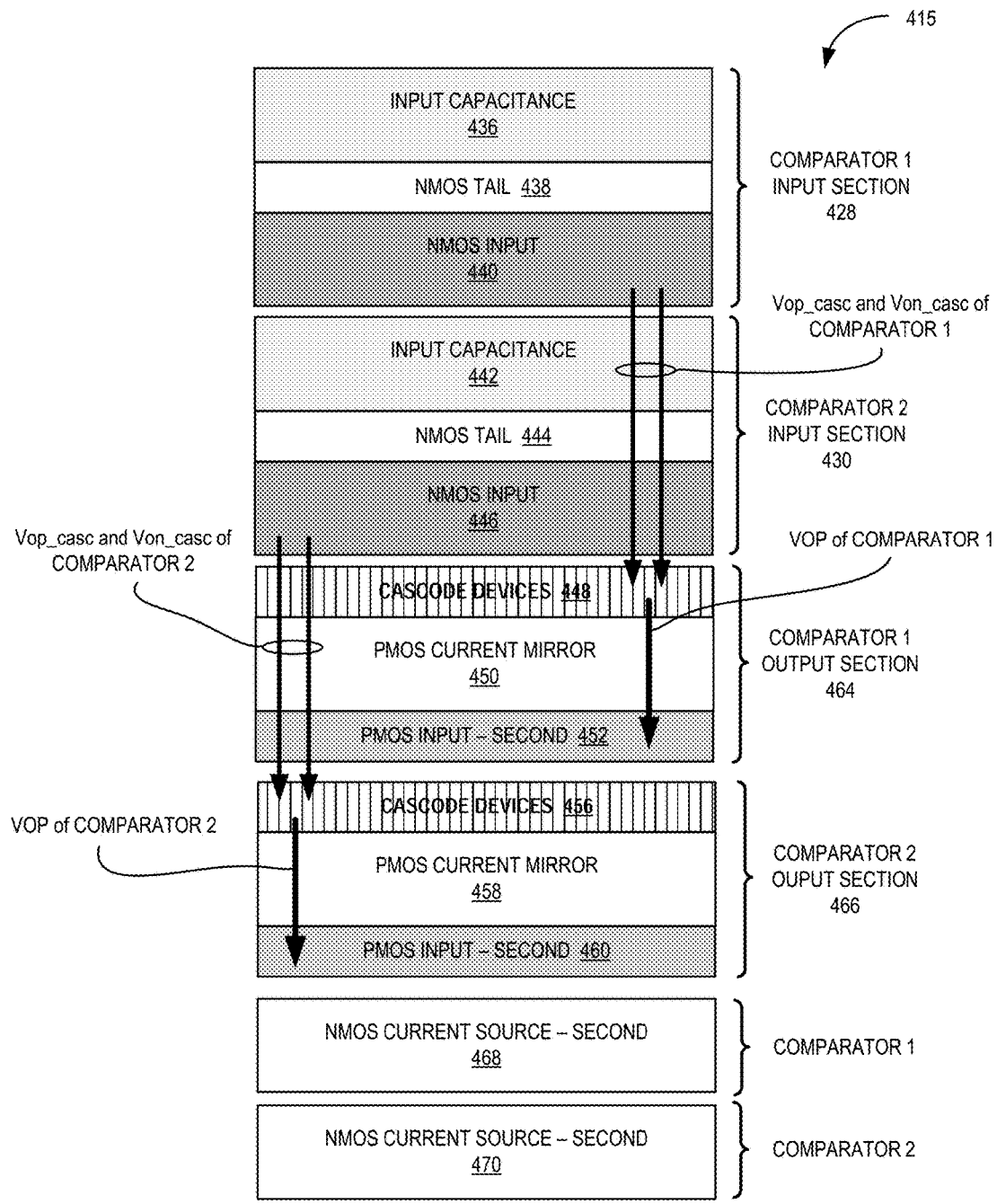
FIG. 4 is an example layout of two comparators physically arranged on a semiconductor die in accordance with an embodiment of the present disclosure.

FIG. 4 is an example layout 415 of two comparators physically arranged on a semiconductor die in accordance with an embodiment of the present disclosure. The layout 415 may be similar to the layout 305 except for the location of NMOS current source—second areas 468 and 470 of comparators 1 and 2, respectively. Instead of these two areas being contiguous with the output sections 464 and 466, the two areas are further separated and arranged below the comparator 2 output section 466.

In the illustrated embodiment of the layout 415, comparators 1 and 2 may have input sections 428 and 430 that are similar to like numbered sections of the layout 305. However, the comparator 1 and 2 output sections 464 and 466, respectively, may not include the NMOS current source—second areas as their counterparts of the layout 305 do. As an alternative, the NMOS current source—second area 468, which may be associated with comparator 1, may be arranged adjacent to the comparator 2 output section 466. Further, the NMOS current source—second area 470, which may be associated with comparator 2, may be arranged adjacent to the NMOS current source—second area 468. Alternatively, the association of areas 468 and 470 may be switched. In this way, the coupling between the output of comparator 1 and comparator 2 output section can be reduced.

Figure 5:
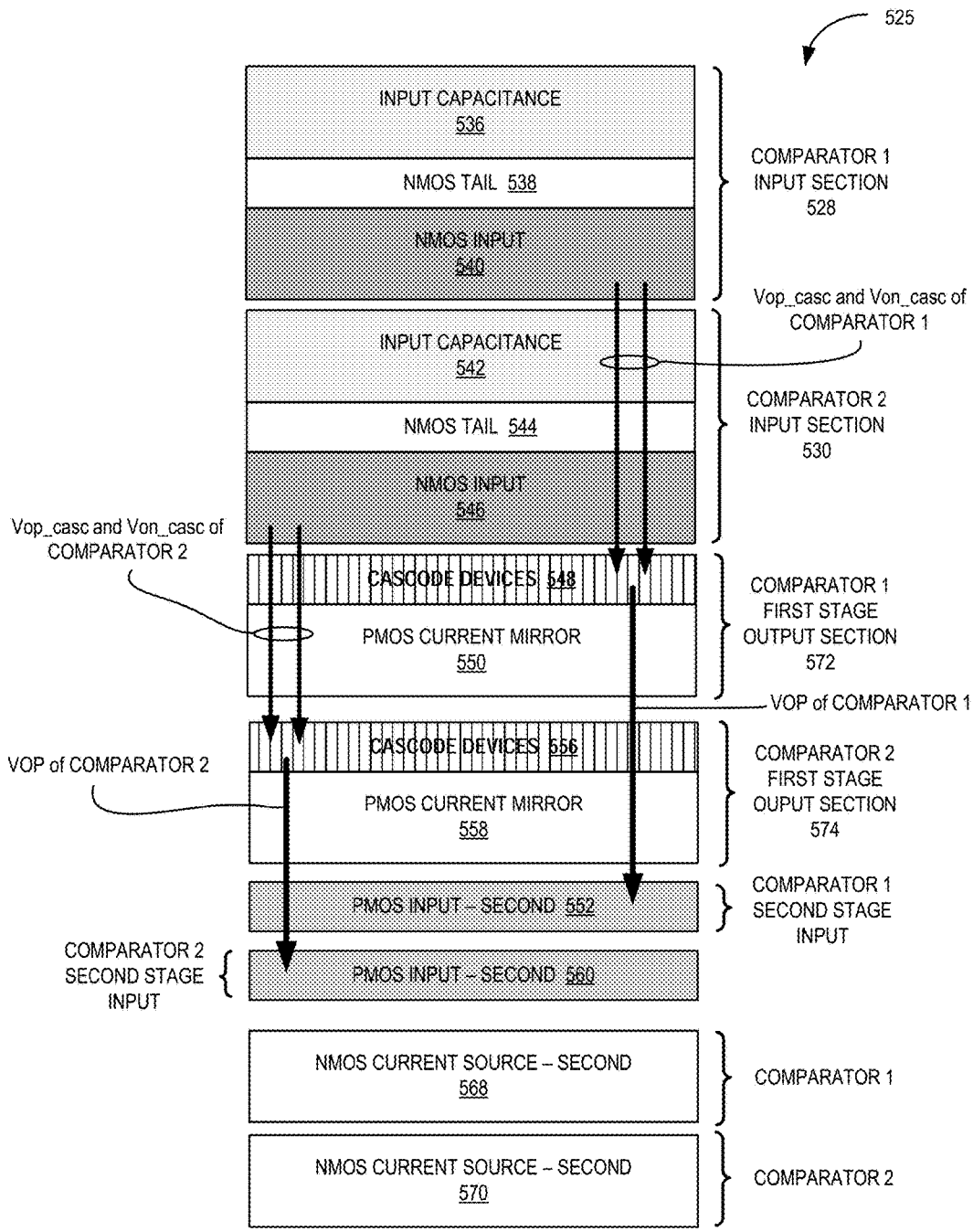
FIG. 5 is an example layout of two comparators physically arranged on a semiconductor die in accordance with an embodiment of the present disclosure.

FIG. 5 is an example layout 525 of two comparators physically arranged on a semiconductor die in accordance with an embodiment of the present disclosure. The layout 525 may be similar to the layouts 305 and/or 415 except for the location of PMOS input—second areas 552 and 560 of comparators 1 and 2, respectively. Instead of these two areas being contiguous with their respective PMOS current mirror areas 550 and 558, they are located adjacent to one another and disposed between the comparator 2 output section 566 and the NMOS current source—second 568 area of comparator 1.

In the illustrated embodiment of the layout 425, the comparators 1 and 2 may have input sections 528 and 530, respectively, that are similar to like numbered sections of the layouts 305 and/or 415. However, the stage 2 input sections of both the comparator 1 and 2 have been split from the respective comparator stage 1 output sections as compared to the layouts 305 and 415. For example, the PMOS input—second areas 552 and 560 of comparators 1 and 2, respectively, have been moved from being adjacent to comparator 1 output section 572 and comparator 2 output section 574, respectively. As a result, the inputs of comparators 1 and 2 have been rearranged as indicated in FIG. 5, which may reduce the coupling between the stage 2 inputs and stage 1 of the comparators 1 and 2.

Figure 6:
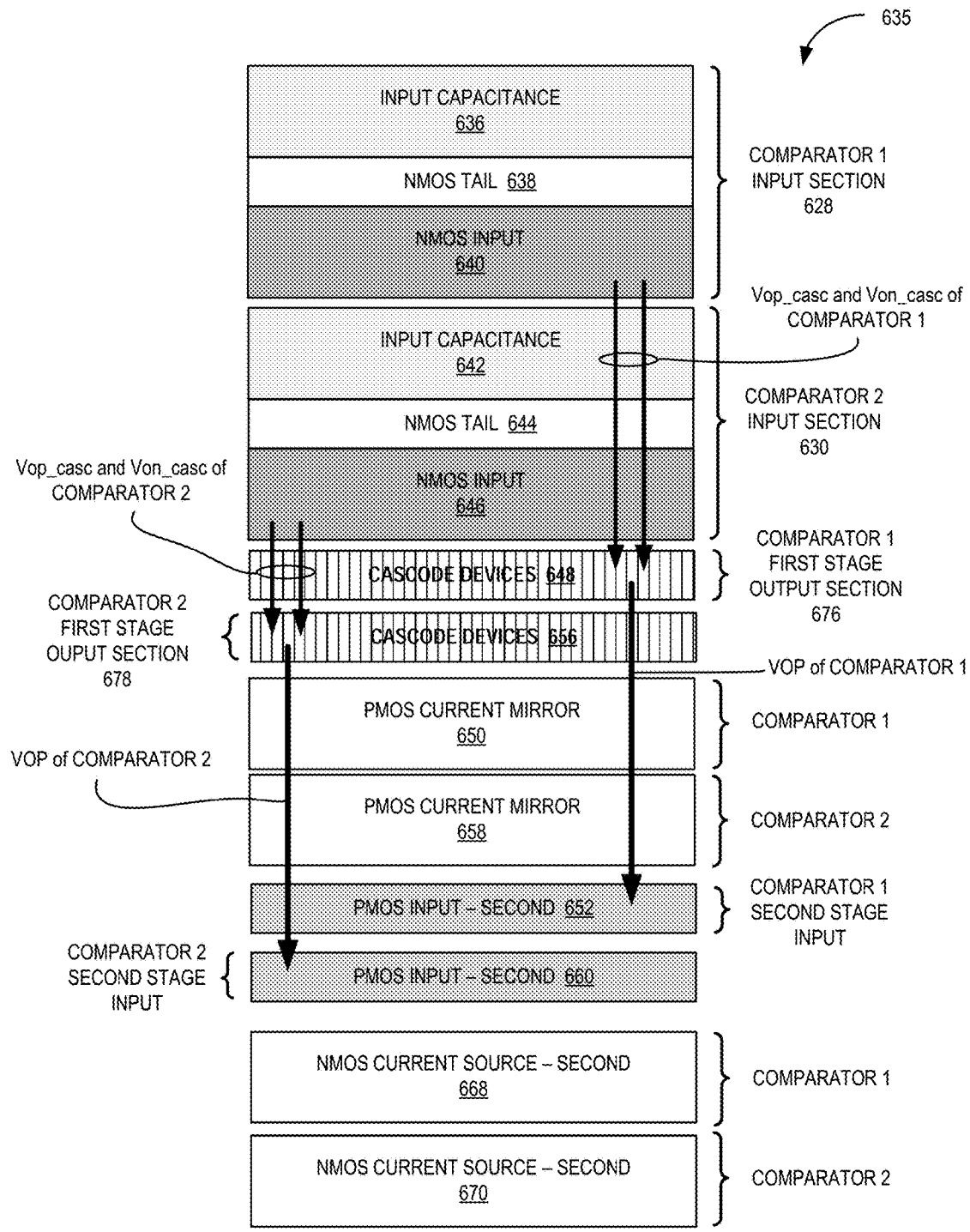
FIG. 6 an example layout of two comparators physically arranged on a semiconductor die in accordance with an embodiment of the present disclosure.

FIG. 6 an example layout 635 of two comparators physically arranged on a semiconductor die in accordance with an embodiment of the present disclosure. The layout 635 may be similar to the layouts 305, 415 and/or 525 except for the location of the cascode devices and PMOS current mirror areas of comparators 1 and 2. Instead of the cascode device and current mirror areas of each comparator being contiguous, e.g., adjacent, with one another, the two areas of each comparator are further split and interleaved.

In the illustrated embodiment of the layout 635, the comparators 1 and 2 may have input sections 628 and 630, respectively, that are similar to like numbered sections of the layouts 305, 415 and/or 525. However, the first stage output sections of both the comparator 1 and 2 have been further split up. For example, the PMOS—current mirror areas 650 and 658 of comparators 1 and 2, respectively, have been moved from being adjacent to cascode device areas 648 and 656, respectively. As a result, the coupling of the cascode devices areas 648 and 656 to both their respective current mirror area 650 and 658, and to the respective second stage inputs 652 and 660 have been reconfigured as shown in FIG. 6. The first and second comparators of layout 635 may benefit from the reduced coupling between stage 1 and stage 2 inputs.

Additionally, and with respect to FIG. 2, the comparators 1 and 2 of the layout 635 may benefit from shared power lines and shared VBIAS lines due to the similar areas of the two comparators being arranged adjacently. For example, arranging the cascode devices areas 648 and 656 adjacently may allow the two areas to share a VBIAS power line. Further, arranging the PMOS current mirror areas 650 and 658 may allow those two areas to share a AVDD power line. The sharing of a power line is likewise capable for the NMOS current source—second areas 668 and 670. By sharing power lines, a width of each power line can be increased over prior power lines, e.g., made wider, which may reduce power line resistance. Further, sharing power lines may reduce a number and/or size of spaces that separate the separate power lines in the various layers of the semiconductor die. In addition, the sharing of the power lines may reduce the complexity of design and provide some synergy between the two comparators.

Yet another benefit from the layout 635 may occur within the adjacent, similar areas themselves. For example, N-doped wells in the cascode devices areas 648 and 656, and the PMOS current mirror areas 650 and 658 may be shared, which may also ease manufacturing and or mask design.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pair of comparators comprising:
   a first comparator comprising a first plurality of device areas, wherein the first plurality of device areas at least includes a first comparator input device area, a first comparator cascode device area, and a first comparator current mirror area, and wherein the first comparator input device area is electrically coupled to the first comparator cascode device area; and
   a second comparator comprising a second plurality of device areas, wherein the second plurality of device areas at least includes a second comparator input device area, a second comparator cascode device area, and a second comparator current mirror area, and wherein the second comparator input device area is electrically coupled to the second comparator cascode device area,
   wherein the second comparator input device area is disposed between the first comparator input device area and the first comparator cascode device area,
   wherein the first comparator cascode device area is disposed between the second comparator input device area and the second comparator cascode device area,
   wherein the first comparator current mirror area is disposed between the first comparator cascode device area and the second comparator current mirror area,
   wherein the second comparator cascode device area is disposed between the first comparator cascode device area and the second comparator current mirror area, and
   wherein the second comparator current mirror area is disposed between the first comparator current mirror area and a second stage input device area of the second comparator.

2. The pair of comparators of claim 1, wherein the first plurality of device areas includes a second stage input device area of the first comparator electrically coupled to the first comparator cascode device area, and wherein the second plurality of device areas includes the second stage input device area of the second comparator electrically coupled to the second comparator cascode device area.

3. The pair of comparators of claim 2, wherein the second stage input device area of the first comparator is adjacent to the first comparator current mirror area, and
wherein the second stage input device area of the second comparator is adjacent to the second comparator current mirror area.

4. The pair of comparators of claim 2, wherein the second stage input device area of the first comparator is disposed between the second comparator current mirror area and the second stage input device area of the second comparator, and
wherein the second stage input device area of the second comparator is disposed between the second stage input device area of the first comparator and the second stage current source device area of the first comparator.

5. The pair of comparators of claim 2, wherein the first plurality of device areas further includes a second stage current source device area of the first comparator, and wherein the second plurality of device areas further includes a second stage current source device area of the second comparator.

6. The pair of comparators of claim 5, wherein the first comparator second stage current source area is disposed between the second stage input device area of the first comparator and the second comparator cascode device area, and
wherein the second stage current source device area of the second comparator is disposed adjacent to the second comparator second stage input device area.

7. The pair of comparators of claim 5, wherein the second stage current source device area of the first comparator is disposed between the second stage input device area of the second comparator and the second stage current source device area of the second comparator.

8. The pair of comparators of claim 1, wherein the first plurality of device areas further includes a first input capacitance area and a first tail area, wherein the first input capacitance area and the first tail area are both electrically coupled to the first comparator input device area.

9. The pair of comparators of claim 1, wherein the second plurality of device areas further includes a second input capacitance area and a second tail area, wherein the second input capacitance area and the second tail area are both electrically coupled to the second comparator input device area.

10. The pair of comparators of claim 1, wherein the first and second comparators are both dual stage comparators.

11. An imaging system comprising:
an array of pixels coupled to photogenerate image data; and
readout circuitry coupled to receive the image data from the array of pixels and convert the image data into digital representations of the image data, the readout circuitry including a plurality of comparators, wherein the readout circuitry includes two comparators of the plurality of comparators for each readout column of a plurality of readout columns, wherein device areas forming the two comparators for each readout column are distributedly arranged, and wherein the distributedly arranged comparators comprise:
a first comparator comprising a first plurality of device areas, wherein the first plurality of device areas at least includes a first comparator input device area, a first comparator cascode device area, and a first comparator current mirror area, and wherein the first comparator input device area is electrically coupled to the first comparator cascode device area; and
a second comparator comprising a second plurality of device areas, wherein the second plurality of device areas at least includes a second comparator input device area, a second comparator cascode device area, and a second comparator current mirror area, and wherein the second comparator input device area is electrically coupled to the second comparator cascode device area,
wherein the second comparator input device area is disposed between the first comparator input device area and the first comparator cascode device area,
wherein the first comparator cascode device area is disposed between the second comparator input device area and the second comparator cascode device area,
wherein the first comparator current mirror area is disposed between the first comparator cascode device area and the second comparator current mirror area,
wherein the second comparator cascode device area is disposed between the first comparator cascode device area and the second comparator current mirror area, and
wherein the second comparator current mirror area is disposed between the first comparator current mirror area and a second stage input device area of the second comparator.

12. The pair of comparators of claim 11, wherein the first plurality of device areas includes a second stage input device area of the first comparator electrically coupled to the first comparator cascode device area, and
wherein the second plurality of device areas includes the second stage input device area of the second comparator electrically coupled to the second comparator cascode device area.

13. The pair of comparators of claim 12, wherein the second stage input device area of the first comparator is adjacent to the first comparator current mirror area, and
wherein the second stage input device area of the first comparator is adjacent to the second comparator current mirror area.

14. The pair of comparators of claim 12, wherein the second stage input device area of the first comparator is disposed between the second comparator current mirror area and the second stage input device area of the second comparator, and
wherein the second stage input device area of the second comparator is disposed between the second stage input device area of the first comparator and the second stage current source device area of the first comparator.

15. The pair of comparators of claim 12, wherein the first plurality of device areas further includes a second stage current source device area of the first comparator, and wherein the second plurality of device areas further includes a second stage current source device area of the second comparator.

16. The pair of comparators of claim 15, wherein the first comparator second stage current source area is disposed between the second stage input device area of the first comparator and the second comparator cascode device area, and
wherein the second stage current source device area of the second comparator is disposed adjacent to the second comparator second stage input device area.

17. The pair of comparators of claim 15, wherein the second stage current source device area of the first comparator is disposed between the second stage input device area of the second comparator and the second stage current source device area of the second comparator.

18. The pair of comparators of claim 11, wherein the first plurality of device areas further includes a first input capacitance area and a first tail area, wherein the first input capacitance area and the first tail area are both electrically coupled to the first comparator input device area.

19. The pair of comparators of claim 11, wherein the second plurality of device areas further includes a second input capacitance area and a second tail area, wherein the second input capacitance area and the second tail area are both electrically coupled to the second comparator input device area.

20. The imaging system of claim 11, wherein the first and second comparators are both dual stage comparators.

* * * * *